United States Patent
Friedberger et al.

(10) Patent No.: US 9,028,698 B2
(45) Date of Patent: May 12, 2015

(54) PARTICLE FILTER AND MANUFACTURING METHOD THEREFOR

(75) Inventors: Alois Friedberger, Oberpframmern (DE); Peter Gluche, Bellenberg (DE); Helmut Seidel, Starnberg (DE)

(73) Assignee: Eads Deutschland GmbH, Ottoburn (DE)

( * ) Notice: Subject to any disclaimer, the term of this patent is extended or adjusted under 35 U.S.C. 154(b) by 1107 days.

(21) Appl. No.: 13/056,258

(22) PCT Filed: Jul. 22, 2009

(86) PCT No.: PCT/EP2009/059449
§ 371 (c)(1),
(2), (4) Date: Jun. 3, 2011

(87) PCT Pub. No.: WO2010/012643
PCT Pub. Date: Feb. 4, 2010

(65) Prior Publication Data
US 2012/0125848 A1  May 24, 2012

(30) Foreign Application Priority Data
Jul. 31, 2008 (DE) .................. 10 2008 035 772

(51) Int. Cl.
*B01D 61/00* (2006.01)
*B01D 67/00* (2006.01)
(Continued)

(52) U.S. Cl.
CPC .............. *B01D 71/021* (2013.01); *C01B 31/06* (2013.01); *C01B 33/027* (2013.01); *C23C 16/042* (2013.01);
(Continued)

(58) Field of Classification Search
CPC ...... B01D 61/00; B01D 67/00; B01D 67/006; B01D 67/0062; B01D 67/0072; B01D 69/02; B01D 71/02; B01D 71/021; B01D 2325/02; B01D 2325/028; B01D 2325/08; B01D 71/04; B01D 71/028; C01B 31/026; C01B 31/06; C01B 31/065; C01B 33/02; C01B 33/027; C23C 16/00; C23C 16/01; C23C 16/04; C23C 16/042; C23C 16/1627
USPC ............ 210/321.84, 500.21, 500.22, 500.25, 210/500.26, 650; 95/45; 96/4, 11; 427/244, 427/245, 248.1, 249.1, 249.2, 249.7, 249.9, 427/249.14; 428/304.4, 307.3, 312.2, 428/312.6; 423/348, 446; 977/778, 780, 977/887–891; 216/41, 47, 51, 96, 99
See application file for complete search history.

(56) References Cited

U.S. PATENT DOCUMENTS 5,753,014 A  5/1998 Van Rijn
6,811,612 B2 * 11/2004 Gruen et al. .................... 117/94
(Continued)

FOREIGN PATENT DOCUMENTS

BR  9707107 A  5/2000
DE  102006026559 A1  12/2007
(Continued)

OTHER PUBLICATIONS
The International Research Report of corresponding International Application No. PCT/EP2009/059449, dated Nov. 2, 2009.
(Continued)

*Primary Examiner* — Joseph Drodge
(74) *Attorney, Agent, or Firm* — Global IP Counselors, LLP

(57) ABSTRACT

A mechanical particle filter comprises a membrane having a plurality of pores. At least one partial region of the surface of the membrane, that is accessible for the medium to be filtered, includes a carbon material having a diamond structure.

22 Claims, 2 Drawing Sheets

(51) Int. Cl.
*B01D 71/02* (2006.01)
*C01B 31/06* (2006.01)
*C01B 33/02* (2006.01)
*C23C 16/04* (2006.01)
*B01D 69/02* (2006.01)
*C01B 33/027* (2006.01)

(52) U.S. Cl.
CPC ........ *B01D 67/0062* (2013.01); *B01D 67/0072* (2013.01); *B01D 69/02* (2013.01); *B01D 2325/028* (2013.01)

(56) References Cited

U.S. PATENT DOCUMENTS

| | | | |
|---|---|---|---|
| 7,101,392 B2* | 9/2006 | Heath | 623/1.18 |
| 7,435,296 B1* | 10/2008 | Sung | 117/72 |
| 8,025,960 B2* | 9/2011 | Dubrow et al. | 428/304.4 |
| 2003/0150791 A1 | 8/2003 | Cho et al. | |
| 2005/0251267 A1* | 11/2005 | Winterbottom et al. | 623/23.63 |
| 2007/0039471 A1* | 2/2007 | Hofmann | 96/4 |
| 2008/0248182 A1* | 10/2008 | Jongsma et al. | 426/580 |
| 2009/0017258 A1* | 1/2009 | Carlisle et al. | 428/143 |
| 2009/0029142 A1* | 1/2009 | Jacobson | 428/304.4 |
| 2009/0131858 A1* | 5/2009 | Fissell et al. | 604/57 |
| 2009/0269491 A1* | 10/2009 | Hammond-Cunningham et al. | 427/246 |
| 2010/0181288 A1* | 7/2010 | Tang et al. | 216/45 |

FOREIGN PATENT DOCUMENTS

| | | |
|---|---|---|
| WO | WO-2005/105276 A2 | 11/2005 |
| WO | WO-2007/140752 A1 | 12/2007 |
| WO | WO-2008/086477 A1 | 7/2008 |

OTHER PUBLICATIONS

Mukherji D et al: "Coating of meso-porous metallic membranes with oriented channel-like fine pores by pulsed laser deposition" Nanotechnology IOP Publishing Ltd. UK, vol. 19, No. 6, Feb. 13, 2008, XP002551 025 ISSN: 0957-4484.

Office Action of the corresponding German Patent office Action No. 10 2008 035 772.3, dated Aug. 17, 2011.

* cited by examiner

PARTICLE FILTER AND MANUFACTURING METHOD THEREFOR

CROSS-REFERENCE TO RELATED APPLICATIONS

This U.S. National stage application claims priority under 35 U.S.C. §119(a) to German Patent Application No. 10 2008 035 772.3, filed in Germany on Jul. 31, 2008, the entire contents of which are hereby incorporated herein by reference.

BACKGROUND

1. Field of the Invention

The present invention relates to a mechanical particle filter comprising a membrane having a multiplicity of pores, and to a method for manufacturing such a particle filter.

2. Background Information

Particle filters of this type are used to filter particles, for example bacteria, from a fluid. The particles filtered out can be analyzed in order to ascertain the pollution of the fluid with specific particles.

US 2003/0150791 A1 discloses a particle filter of the type mentioned in the introduction, wherein the membrane is formed from a silicon-based material. In order to form the pores, a mask material is applied to the silicon and small spheres are pressed into said mask material and displace the mask material at points. Afterward, the locations of the silicon membrane that have been uncovered in this way are etched open to create pores. Finally, the mask material is removed.

By contrast, U.S. Pat. No. 5,753,014 discloses a method for manufacturing a membrane filter, wherein a mask can be lithographically applied with the aid of a photosensitive layer. After exposure, the pores of the membrane are produced by etching.

DE 10 2006 026 559 A1 discloses the porosification of a substrate, for example composed of silicon, proceeding from the surface thereof, such that it is pervaded by thin channels or holes. This process can be adapted for example by electrochemical etching with light irradiation. As soon as the desired membrane thickness has been reached, the porosification process is ended.

SUMMARY

The invention is based on the object of providing an, in particular mechanical, particle filter of the type mentioned in the introduction which has an improved mechanical and chemical stability in comparison with known particle filters. Moreover, the intention is to provide a method for manufacturing such an improved particle filter.

In order to achieve said object, a particle filter is proposed wherein at least one partial region of a surface of the membrane which is accessible for the medium to be filtered is produced from and/or coated with a carbon material having a diamond structure.

An advantageous manufacturing method for the particle filter is the subject matter of the alternative independent claim.

Advantageous configurations of the invention are the subject matter of the dependent claims.

The particle filter according to the invention has the advantage that the carbon material having a diamond structure is almost completely inert chemically. As a result, simple purification, that is to say removal of the particles accumulated by the filter, can be realized in a simple manner since the particles scarcely form stable bonds with the membrane. Furthermore, a carbon material having a diamond structure is very stable mechanically, such that, when the filter is used, a high differential pressure between the two sides of the membrane can be used. The flow rate through the filter is thereby increased.

The membrane can be produced completely from the carbon material. Since the carbon material is transparent on account of its diamond structure, a membrane constructed in this way makes it possible, by means of simple translumination of the membrane, to identify residual contaminants after purification or structural defects in the membrane in a simple manner.

The membrane can be produced completely from diamond.

The membrane is advantageously supported by a carrier, to which it is fixed. This further increases the loading capacity of the particle filter.

The carrier can be formed from a material which can be patterned by lithographic methods. This makes it possible to use the frame material during the manufacture of the membrane as a support and subsequently to remove it in a gentle manner from the porous region of the membrane.

In an advantageous configuration, the material of the carrier has a crystal structure which predetermines the direction of an anisotropic etching process. The form of the carrier can be determined reliably in such a material.

The carrier can be formed from silicon. Silicon has the advantage that it is available inexpensively, can be subjected to lithography in industrially known methods and is mechanically stable.

The silicon advantageously has a (110) orientation. By virtue of this orientation, sidewalls of the carrier which are almost completely planar and perpendicular to the surface of the membrane are achieved in the course of etching after the lithography.

In the method proposed for advantageous manufacture, firstly an etching mask is applied on one side of a carrier and patterned, then a layer composed of a carbon material having a diamond structure is applied on the other side, wherein an etching mask is applied to the layer composed of carbon material and is patterned, then the layer composed of carbon material is patterned by etching, and, finally, the carrier is patterned by etching.

Such a method has the advantage that it produces a membrane which has a high loading capacity and which is adapted to the carrier in such a way that it has no prestresses. Furthermore, the thickness of the layer composed of carbon material and also the arrangement and form of the pores can be defined in a simple manner.

In an advantageous configuration, the layer composed of carbon material is patterned by plasma etching. This method allows a reliable definition of the pore size and produces pore walls having low roughness.

The carrier can be patterned by wet-chemical anisotropic etching. This allows the excess carrier material to be removed, without the membrane being attacked.

The etching masks are advantageously removed after patterning. This avoids a situation in which the material of the etching masks comes into contact with the fluid to be filtered and possibly enters into chemical or physical interactions which can destroy the particle filter or influence the result of analyses.

The carrier and/or the membrane can finally be coated with a layer composed of carbon material having a diamond structure. The entire particle filter is thus reliably separated from the fluid to be filtered.

The layer composed of carbon material can be deposited by means of chemical vapor deposition in a methane-hydrogen atmosphere. This constitutes a particularly uniform and reliable deposition of diamond-like carbon.

BRIEF DESCRIPTION OF THE DRAWINGS

Details and further advantages of the particle filter according to the invention and of the method according to the invention will become apparent from the following description of a preferred exemplary embodiment. In the drawings, which only schematically illustrate the exemplary embodiment, specifically.

DETAILED DESCRIPTION OF EMBODIMENTS

Figure 1:
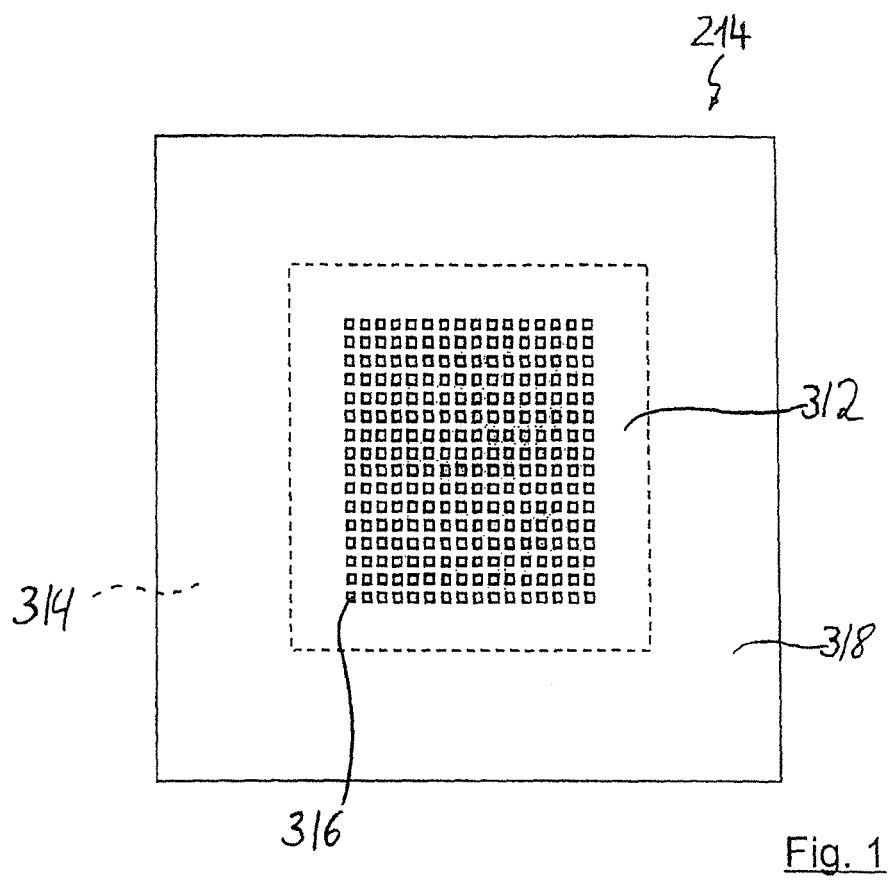
FIG. 1 illustrates a plan view of a particle filter.
Figure 2:
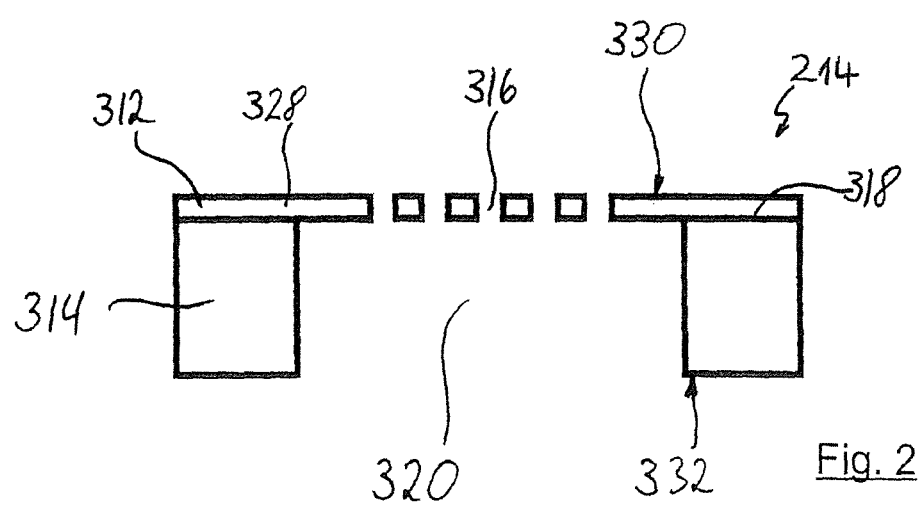
FIG. 2 illustrates a cross section through a particle filter along the line II-II in FIG. 1.

The particle filter 214 shown in FIG. 1 and FIG. 2 has a membrane 312 and a carrier 314. Pores 316 arranged in a grid are introduced into the membrane 312. The pores 316 have a round or square cross section.

The carrier 314 supports the membrane 312 in an edge region 318. A through-flow region 320 is provided in the region of the pores 316.

The manufacture of the particle filter 214 will be described below with reference to the figures.

Figure 3:
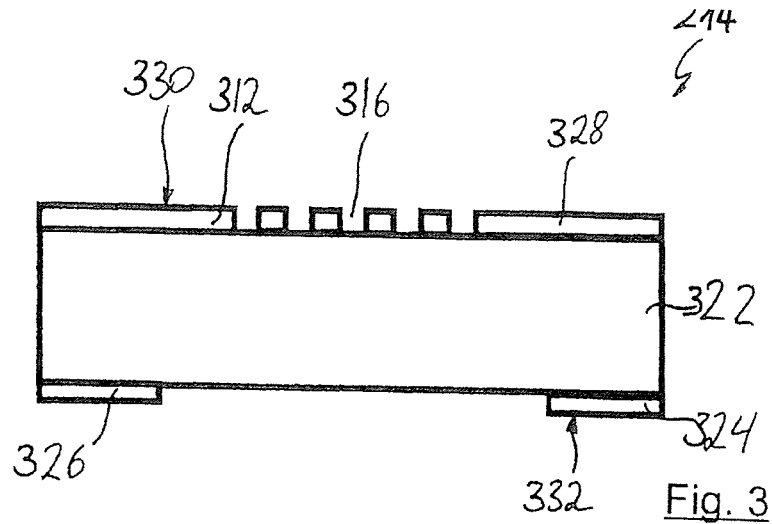
FIG. 3 illustrates a cross section through a particle filter as in FIG. 2 during a production step.

As shown in FIG. 3, a silicon wafer 322 having a (110) crystal orientation is provided as the starting material.

The silicon 323 is thermally oxidized, such that, for example, $SiO_2$ 324 having a thickness of approximately 500 nm is produced. The $SiO_2$ 324 formed is subsequently removed from the front side 330. The $SiO_2$ 324 on the rear side 332 is patterned in order later as etching mask 326.

On the front side, diamond 328 or DLC (diamond-like carbon) is deposited for example with a thickness of approximately 1 µm. A chromium layer is applied with a thickness of approximately 100 nm, for example, and patterned. It serves as an etching mask for the subsequent patterning of the diamond 328.

The diamond 328 is preferably patterned by plasma etching and the chromium mask is subsequently removed. FIG. 3 shows the particle filter after this step.

The front side 330 is then protected in an etching holder and the silicon is etched wet-chemically anisotropically starting from the rear side 332. By way of example, TMAH or potassium hydroxide is appropriate as etchant. In this case, the $SiO_2$ 324 on the rear side 32 serves as an etching mask 326. After the conclusion of the etching process, this layer is removed. The particle filter 214 then appears as in FIG. 2.

Finally, the complete particle filter 214 can be coated with a diamond layer 334, as a result of which an extremely stable particle filter 214 that is both chemically and mechanically resistant arises. Even the silicon is protected and the entire particle filter 214 is enveloped with diamond 328. The only exception to this is possible outer areas that are uncovered when the particle filters 214 are sawn apart (separated). However, the outer areas are generally separated anyway by sealing rings from the fluid to be filtered.

If such outer areas are also intended to be protected, the individual chips or particle filters 214 can be coated with a diamond layer 334 after the separation of the wafer.

The diameter of the pores 316 decreases as a result of the additional diamond layer 334. This should already be taken into account during the patterning of the chromium mask, particularly if a desired diameter of the pores of approximately 450 nm, for example, is intended to be obtained.

Figure 5:
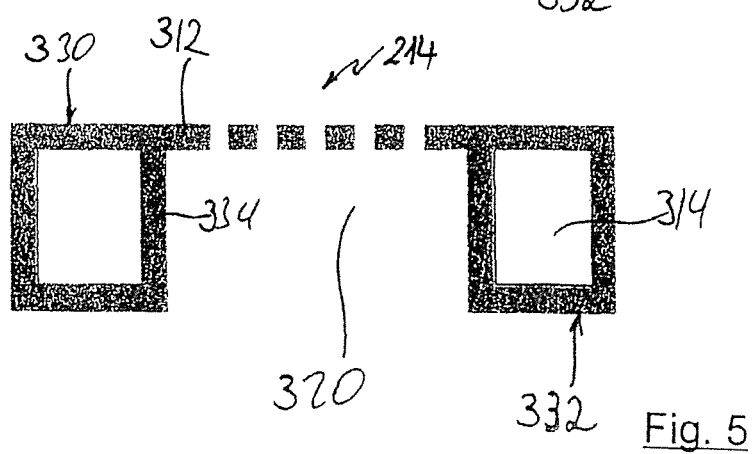
FIG. 5 shows a section as in FIG. 2 through a diamond-coated particle filter.

The particle filter 214 illustrated in FIG. 5 thus acquires a diamond layer 334 which protects it against chemical and mechanical influences.

Alternatively, the silicon can be completely removed, as a result of which individual thin filter membranes are obtained.

The use of silicon having a (110) orientation has the advantage that perpendicular walls arise during etching, as a result of which a high packing density of particle filters 214 on a silicon wafer 322 is achieved. This can also be obtained by dry etching of the silicon, although this process is more cost-intensive. In addition, it should be ensured in this case that the etching process is ended upon reaching the diamond 328.

However, the silicon wafer 322 can also consist of silicon having a (100) orientation. During the wet-chemical anisotropic etching of such a silicon wafer 322, however, oblique edges rather than perpendicular edges are produced, as a result of which the packing density is reduced.

Figure 4:
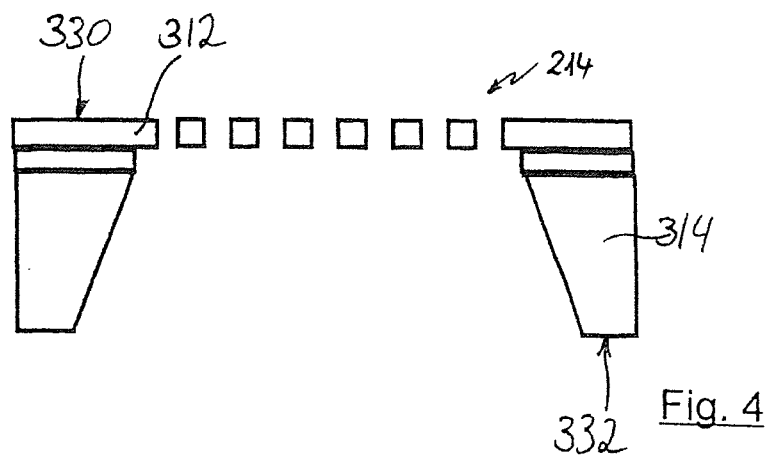
FIG. 4 illustrates a section through a particle filter as in FIG. 2 with an alternative orientation of the lattice structure of the carrier.

As an alternative to thermally oxidized silicon ($SiO_2$ 324), it is also possible to use other etching masks, for example differently deposited $SiO_2$ 324 or $Si_3N_4$. A use of SOI wafers or the utilization of further methods is likewise conceivable. A particle filter 214 with use of SOI wafers having a (100) orientation is shown in FIG. 4.

The particle filters 214 completed by such an alternative process can subsequently be provided with a diamond layer 334, as a result of which a particle filter 214 completely protected by a diamond 328 once again arises. This method involves greater outlay in terms of processing, but affords the advantage that the diamond layer 334 does not have to be patterned.

Instead of silicon, it is also possible to use other materials as carrier for the membrane 312 composed of diamond 328. In particular, hard metal, titanium or refractory metals such as, for example, W, Ta, Mo and the carbides thereof are appropriate in this case. SiC and $Si_3N_4$ are likewise particularly suitable.

The diamond deposition takes place, in particular, by means of CVD (chemical vapor deposition) in a methane-hydrogen atmosphere. The energy required for the dissociation of the gases is advantageously made available by a hot filament. However, microwave plasma or impulse discharge excitation (arc jet) is also possible.

In order to detect the particles, the latter can be marked with fluorescent dyes. These dyes are excited by a laser and the emitted light is measured by a detector.

Since diamond is transparent, the use of the particle filters 214 described here enables the illumination and the detection to be effected from different sides. This is advantageous when detecting the particles.

The particle filters 214 comprising a membrane 312 composed of diamond 328 are particularly suitable in particular for determining and measuring viruses in media such as blood and saliva. Relatively fine pores 316, for example having a diameter of 50 nm, are used for this purpose. Pores 316 having a very small diameter beyond the resolution limit of conventional exposure and patterning methods can be manufactured reproducibly by a finished particle filter, or one in which at least the diamond 328 has already been patterned, being coated with a further diamond layer 334. Pores 316 are narrowed as a result.

Direct detection without fluorescence can be used, particularly in the case of spatially resolved illumination, in order to be able to identify structural defects in the particle filter 214 or inadequate purification. This information can furthermore be evaluated in such a way that a warning indication is issued or the particle filter 214 is exchanged.

In order to detect bacteria in drinking water, the hole diameter can be 450 nm. In this case, the membrane thickness is approximately 1 µm.

The pores 316 are intended to have a high verticality with respect to the surface of the membrane 312.

The roughness of the perforation on the inner side of the pores 316 is rms<2 µm, preferably rms<100 nm, and particularly preferably <50 nm.

The grain size of the diamond layer is intended to be less than 1 µm, preferably less than 50 nm, and particularly preferably less than 20 nm.

The flexural bending stress of the diamond layer is intended to be more than 1 GPa, preferably more than 4 GPa, and particularly preferably more than 7 GPa. The modulus of elasticity is intended to be above 500 GPa, preferably above 700 GPa, and particularly preferably above 1000 GPa.

The particle filters 214 can be used not only for detection or analysis, but also for the targeted purification of media (filtering), for example for the purification of drinking water.

The particle filter 214 allows accumulation of bacteria in water or air through a micromechanical surface filter, for example in order to improve a detection limit of an analysis device. By virtue of the use of diamond 328 in the membrane 312, the particle filter 214 has a high chemical and mechanical robustness. This brings about a high degree of recycling and hence a high degree of automation.

As is described in greater detail in DE 10 2006 026 559 A1, to which reference is expressly made for further details, the particle filter can be used in a detection method in which, in order to detect specific particles in media (e.g. bacteria in drinking water), the medium is pumped through thin filters. The particle filter 214 has pores 316 having a diameter adapted in such a way that the particles to be detected and all particles which are just as large or larger remain on the filter surface, i.e. are accumulated there.

As described here, diamond or a diamond-like material will be used as material for such a filter, in order to achieve very high mechanical and chemical stability.

The high mechanical stability makes it possible to generate a high differential pressure between the two sides of the membranes, as a result of which the flow rate through the filter can be increased. Alternatively or additionally, the pore density can be increased in order to increase the percentage proportion of the total area of the filter that is constituted by the pore area. This is of interest particularly with regard to a miniaturization of the overall system.

Both liquids and gases can be appropriate as media to be filtered. FIGS. 1 and 2 show a plan view and a cross section through the particle filter used as filter element. The pores are preferably round, but can also have some other form.

After the accumulation of the particles on the filter surface, they are detected directly or e.g. after marking with dyes. In particular, the particles, e.g. bacteria, viruses or toxins, can be specifically provided with fluorescent dyes, e.g. fluorescence-marked antibodies, in order to detect them after excitation with light having a suitable wavelength by means of a detector, e.g. photomultiplier or CCD camera. This principle can also be applied to other marking and detection methods.

In order to enable fully automatic operation in a detection system, the fluidic system and in particular the filter is cleaned after each sample examined. In this case, all previously added substances (sample to be examined, marking substances, auxiliary reagents, dirt and impurities) are removed by the use of aggressive chemicals such as e.g. acids, alkaline solutions or solvents for cleaning purposes.

What is claimed is:

1. A particle filter comprising:
   a membrane defining a plurality of pores, and having a surface that is accessible to a medium to be filtered, the surface including a carbon material having a diamond structure or coated with the carbon material, and the surface having the following characteristics:
   a flexural bending stress of greater than 1 GPa; and
   a modulus of elasticity greater than 700 GPa.

2. The particle filter as claimed in claim 1, wherein the entire membrane includes the carbon material.

3. The particle filter as claimed in claim 2, wherein the membrane includes diamond.

4. The particle filter as claimed in claim 1, wherein the membrane is supported by a carrier.

5. The particle filter as claimed in claim 4, wherein the carrier includes a material that is patterned by lithography.

6. The particle filter as claimed in claim 5, wherein the material of the carrier has a crystal structure which predetermines the direction of an anisotropic etching process.

7. The particle filter as claimed in claim 6, wherein the carrier includes silicon.

8. The particle filter as claimed in claim 7, wherein the silicon has a (110) orientation.

9. The particle filter as claimed in claim 1, wherein at least some of the pores have a diameter of less than 500 nm.

10. The particle filter as claimed in claim 1, wherein the membrane has a thickness within a range of substantially 0.8 µm and substantially 1.2 µm.

11. The particle filter as claimed in claim 1, wherein
    the pores extend substantially perpendicularly to the membrane surface.

12. The particle filter as claimed in claim 1, wherein
    an inner side of the pores has a roughness rms of less than 2 µm.

13. The particle filter as claimed in claim 1, wherein
    a grain size of the carbon material having the diamond structure is less than 1 µm.

14. The particle filter as claimed in claim 1, wherein the flexural bending stress is greater than 7 GPa.

15. The particle filter as claimed in claim 1, wherein
    the modulus of elasticity is greater than 1000 GPa.

16. A method for manufacturing a particle filter as claimed in claim 1, comprising:
    applying a layer as a first etching mask to a side of a carrier and patterning the etching mask;
    applying a layer comprising a carbon material having a diamond structure to another side of the carrier;
    applying second etching mask to the layer including the carbon material and patterning the second etching mask;
    patterning the layer including the carbon material by etching, and
    patterning the carrier by etching.

17. The method as claimed in claim 16, wherein the layer including the carbon material is patterned by plasma etching.

18. The method as claimed in claim 16, wherein the carrier is patterned by wet-chemically anisotropic etching.

19. The method as claimed in claim 16, further comprising removing the etching masks after patterning the layer and carrier.

20. The method as claimed in claim 16, wherein at least one of the carrier and the membrane are coated with the layer comprising the carbon material.

21. The method as claimed in claim 16, wherein the layer comprising the carbon material is deposited by chemical vapor deposition in a methane-hydrogen atmosphere.

22. A method for using the particle filter as claimed in claim 1, comprising at least one of the following:
   positioning the particle filter for through-flow filtration of the medium; and
   positioning the particle filter for cross-flow filtration of the medium.

* * * * *